US012772574B2

(12) United States Patent
Chen et al.

(10) Patent No.: US 12,772,574 B2
(45) Date of Patent: Oct. 20, 2026

(54) INTEGRATED CIRCUIT WITH ELECTROSTATIC DISCHARGE STRUCTURE

(71) Applicants: TAIWAN SEMICONDUCTOR MANUFACTURING COMPANY, LTD., Hsinchu (TW); TSMC CHINA COMPANY LIMITED, Shanghai (CN); TSMC NANJING COMPANY LIMITED, Nanjing (CN)

(72) Inventors: CunCun Chen, Shanghai City (CN); XinYong Wang, Shanghai City (CN); Liu Han, Nanjing City (CN); HaiBi Tang, Shanghai City (CN); HuoXiang Peng, Shanghai City (CN); Yi-Feng Chang, New Taipei City (TW)

(73) Assignees: TAIWAN SEMICONDUCTOR MANUFACTURING COMPANY, LTD., Hsinchu (TW); TSMC CHINA COMPANY LIMITED, Shanghai (CN); TSMC NANJING COMPANY LIMITED, Nanjing (CN)

( * ) Notice: Subject to any disclaimer, the term of this patent is extended or adjusted under 35 U.S.C. 154(b) by 351 days.

(21) Appl. No.: 18/637,342

(22) Filed: Apr. 16, 2024

(65) Prior Publication Data

US 2025/0318278 A1 Oct. 9, 2025

(30) Foreign Application Priority Data

Apr. 3, 2024 (CN) ......................... 202420685029.7

(51) Int. Cl.
*H10D 89/60* (2025.01)

(52) U.S. Cl.
CPC .................................. *H10D 89/811* (2025.01)

(58) Field of Classification Search
CPC ............................ H10D 89/611; H10D 89/811
See application file for complete search history.

(56) References Cited

U.S. PATENT DOCUMENTS

| | | | | |
|---|---|---|---|---|
| 2004/0188776 A1* | 9/2004 | Russ | ...................... | H10D 30/60 257/401 |
| 2012/0161232 A1 | 6/2012 | Farbiz et al. | | |
| 2020/0227914 A1* | 7/2020 | Salcedo | ............... | H02H 11/002 |
| 2021/0111173 A1 | 4/2021 | Liu et al. | | |
| 2022/0285339 A1* | 9/2022 | Chang | .................... | H02H 9/046 |

FOREIGN PATENT DOCUMENTS

| | | | |
|---|---|---|---|
| CN | 114783994 | A | 7/2022 |
| TW | 200509363 | A | 3/2005 |
| TW | 202316617 | A | 4/2023 |

* cited by examiner

*Primary Examiner* — Daniel P Shook
(74) *Attorney, Agent, or Firm* — Maschoff Brennan

(57) ABSTRACT

An integrated circuit includes a first active area of a first conductivity type being coupled to an input/output (I/O) pad; a second active area of a second conductivity type, different from the first conductivity type, being coupled to a first supply voltage terminal; a plurality of first gate structures extending in a first direction to pass through the first and second active areas; and a first well of the second conductivity type extending along the first direction. The first and second active areas extend along a second direction different from the first direction in the first well, and the first active area is aligned with the second active area along the first direction.

20 Claims, 13 Drawing Sheets

INTEGRATED CIRCUIT WITH ELECTROSTATIC DISCHARGE STRUCTURE

CROSS REFERENCE

The present application claims priority to China Application Serial Number 202420685029.7 filed on Apr. 3, 2024, which is herein incorporated by reference in its entirety.

BACKGROUND

An electrostatic discharge (ESD) event produces extremely high voltages and leads to pulses of high current of a short duration that can damage integrated circuit devices. Accordingly, it is necessary for an integrated circuit to equip proper ESD protection device(s) between an input/output pad and internal core circuit(s) to prevent internal core circuit(s) from undesired ESD current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
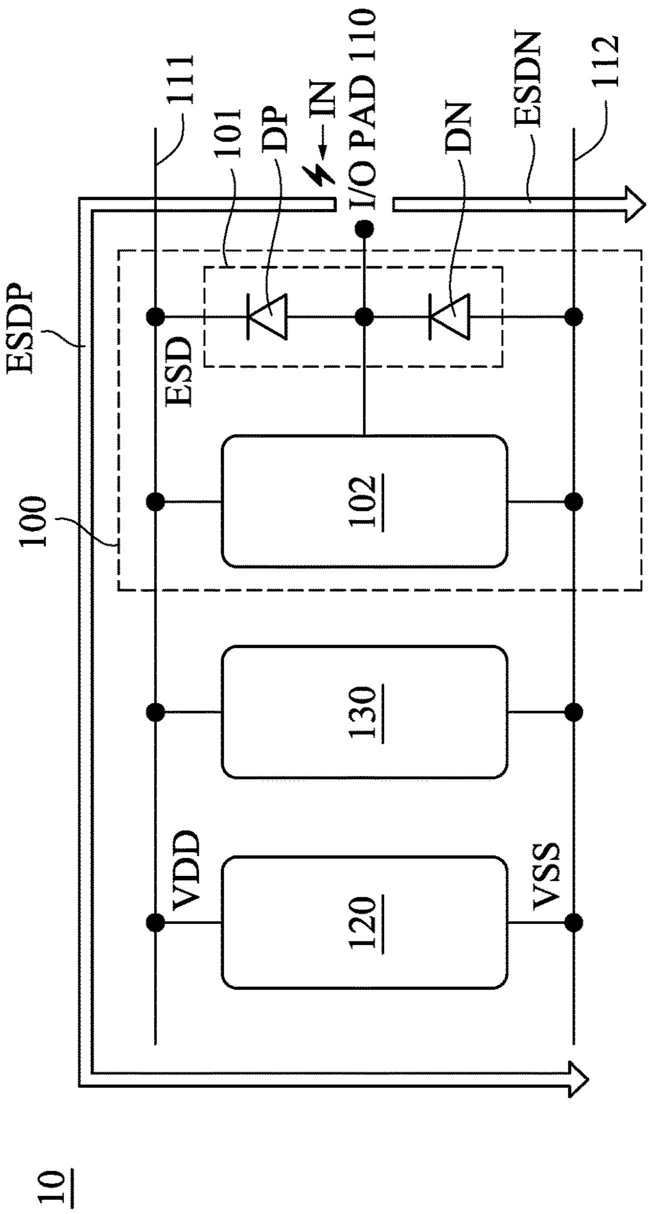
FIG. 1A is a block diagram of part of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a block diagram of part of an integrated circuit 10, in accordance with some embodiments. For illustration, the integrated circuit 10 includes an input/output device 100 coupled to an input/output (I/O) pad 110, a power clamp circuit 120, and a logic circuit 130. The input/output device 100, the power clamp circuit 120, and the logic circuit 130 are coupled in parallel between supply voltage terminals 111 and 112. In some embodiments, the supply voltage terminal 111 is configured to provide a supply voltage VDD and the supply voltage terminal 112 is configured to provide a supply voltage VSS smaller than the supply voltage VDD, for example, the supply voltage VSS being a ground voltage.

In some embodiments, the input/output device 100 includes an electrostatic discharge (ESD) protection device 101 and receiver/transmitter 102 that are coupled between the supply voltage terminals 111 and 112. The ESD protection device 101 includes diodes DP and DN. The anode of the DP, the cathode of the diode DN, and a terminal of the receiver/transmitter 102 are coupled together to the I/O pad 110. The cathode of the diode DP and anode of the diode DN are coupled to the supply voltage terminals 111 and 112 respectively.

In some embodiments, the logic circuit 130 is coupled to the I/O pad 110 through the I/O device 100. For example, the logic circuit 130 is configured to receive signals inputted from the I/O pad 110 through the I/O device 100, or to transmit signals outputted to the I/O pad 110 through the I/O device 100. In some embodiments, the logic circuit 130 includes logics or circuits that are configured to process, or operate in response to, external signals transmitted through the I/O pad 110.

During an electrostatic discharge event, there is an instantaneous built-up of a substantial electrical positive potential at the I/O pad 110, which is generally caused by direct or indirect contact with an electrostatic field. As the ESD event occurs, multiple ESD paths, including, for example, ESDP and ESDN as shown in FIG. 1A, are conducted in the integrated circuit 10, for the ESD current IN to be discharged.

Specifically, as shown in FIG. 1A, one part of the ESD charge current IN flows between the I/O pad 110 and the voltage terminal VSS, and is directed through the ESD path ESDP which is formed by the diode DP and the power clamp circuit 120. Another part of the ESD charge current IN flows from the I/O pad 110 is directly released to the supply voltage terminal 111 by the ESD path ESDN formed of the diode DN. Details of the semiconductor structure of the diode DP and the diode DN are discussed with embodiments of FIGS. 1B-6.

Figure 1B:
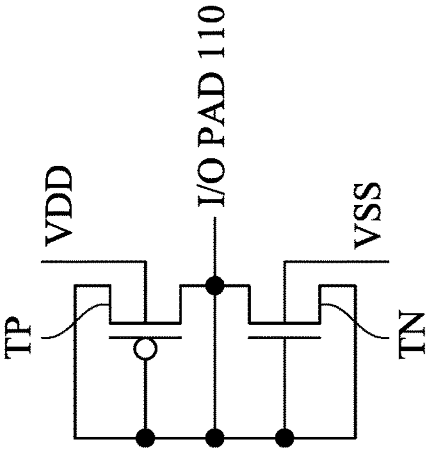
FIG. 1B is a schematic diagram of part of the integrated circuit corresponding to FIG. 1A, in accordance with some embodiments.

Reference is now made to FIG. 1B. FIG. 1B is a schematic diagram of part of the integrated circuit 10 corresponding to FIG. 1A, in accordance with some embodiments. In the embodiments of FIG. 1B, the diode DP is implemented by a transistor TP of P conductivity type, and the diode DN is implemented by a transistor TN of N conductivity type. In some embodiments, gate, source, and drain terminals of the transistor TP correspond to the anode of the diode DP, and a body of the transistor TP corresponds to the cathode of the diode DP. Gate, source, and drain terminals of the transistor TN correspond to the cathode of the diode DN, and a body of the transistor TN corresponds to the anode of the diode DN. Specifically, the gate, source, and drain terminals of the transistor TP are coupled with each other at the I/O pad 110, and the body of the transistor TP is configured to receive the supply voltage VDD. Similarly, the gate, source, and drain terminals of the transistor TN are coupled with each other at the I/O pad 110, and the body of the transistor TN is configured to receive the supply voltage VSS.

The configurations of FIGS. 1A-1B are given for illustrative purposes. Various implements are within the contemplated scope of the present disclosure. For example, in some embodiments, the integrated circuit 10 further includes decoupling capacitance device(s) coupled between the I/O device 100 and the I/O pad 110. In some embodiments, the decoupling capacitance device(s) is configured to stabilizing power supply in the integrated circuit 10.

Figure 2A:
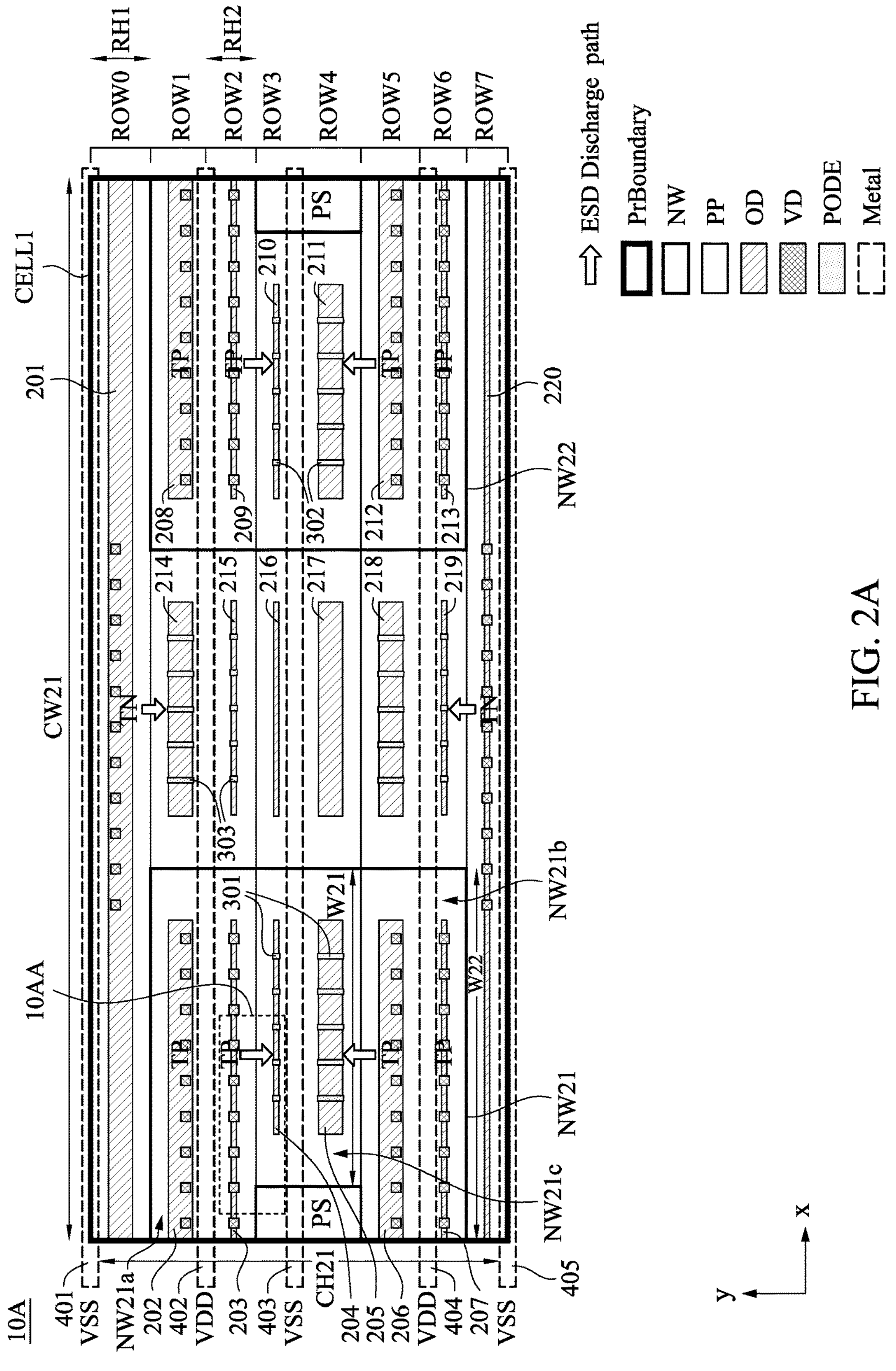
FIG. 2A is a schematic diagram in a layout view of part of an integrated circuit corresponding to FIGS. 1A-1B, in accordance with some embodiments.

Reference is now made to FIG. 2A. FIG. 2A is a schematic diagram in a layout view of part of an integrated circuit 10A corresponding to FIGS. 1A-1B, in accordance with some embodiments. In some embodiments, the integrated circuit 10A is configured with respect to, for example, the integrated circuit 10 of FIGS. 1A-1B.

As shown in FIG. 2A, the integrated circuit 10A includes a cell CELL1 arranged in several cell rows ROW0 to ROW7 that extend in x direction and abut each other along y direction. The cell CELL1 includes active areas (i.e., oxide diffusions, OD) 201-220, gate structures (i.e., polysilicon (PODE) 301-303, and conductive lines 401-405. For illustration, the cell rows ROW0-ROW7 includes a first group of rows ROW0-ROW1, ROW4-ROW5 having a row height RH1 and a second group of rows ROW2-ROW3, ROW6-ROW7 having a row height RH2. In some embodiments, the row height RH1 is different from the cell height RH2. In various embodiments, the row height RH1 is greater than the row height RH2. In some embodiments, the conductive lines 401-405 extend in x direction are metal zero (MO) conductive routing structures to the provide supply voltages VDD and VSS for the cell CELL1.

In some embodiments, the active areas 201 and 220 are N type doped and correspond to drain and source of the transistor TN. The active areas 201 and 220 are coupled to the I/O pad 110 through vias VD. The active areas 214-215 and 218-219 of P conductivity type are coupled to the supply voltage terminal 112 to receive the supply voltage VSS.

The active areas 202-203, 206-207 of P conductivity type in an N well NW21 and the active areas 208-209, 212-213 of P conductivity type in an N well NW22 correspond to the drain and the source of the transistor TP. The active areas 202-203, 206-207, 208-209, and 212-213 are coupled to the I/O pad 110 through vias VD. The active areas 204-205 and 210-211 of N conductivity type are coupled to the supply voltage terminal 111 to receive the supply voltage VDD.

As illustratively shown in FIG. 2A, the active areas 201 and 220 are arranged in cell rows ROW0 and ROW7 respectively. The active areas 202-207 in different cell rows ROW1-ROW6 extend along x direction in the N well NW21, and are align with and separated from each other along y direction. The active areas 204-205 are interposed between the active areas 202-203 and 206-207.

In the layout view of FIG. 2A, the N well NW21 extends in y direction to form a polygon shape, for example, C shape, and has the opening to expose a substrate PS on which the N well NW21 is disposed. Specifically, the active areas 202-203 and 206-207 are arranged in two flange portion NW21*a*-NW21*b* of C-shape N well NW21, and the active areas 204-205 are arranged in a web portion NW21*c* of the N well NW21. In some embodiments, a width W21 of the web portion NW21*c* is different from a width W22 of the flange portions NW21*a*-NW21*b*. For example, in the embodiments of FIG. 2A, the width W21 is smaller than the width W22.

The active areas 208-213 and the N well NW22 have configurations similar to that of the active areas 202-207 and the N well NW21. Hence, the repetitious descriptions are omitted here. Furthermore, the web portions of the N wells NW21-NW22 are back to back arranged, as shown in FIG. 2A. Alternatively stated, the openings of the N wells NW21-NW22 face oppositely along x direction.

In some embodiments, the openings of the N wells NW21-NW22 is for abutment of the cell (ESD protection cell) CELL1 and other standard cell implemented for the logic circuit 130.

With reference to FIGS. 1A-1B and FIG. 2A together, in operation during an ESD negative-to-VSS (hereinafter referred to as "NS mode") or negative electrostatic discharged event, there is an instantaneous build-up of a substantial electrical negative potential at the I/O pad 110. The transistor TN is turned on to discharge negative ESD current from the I/O pad 110 to the supply voltage terminal 112 through a first semiconductor structure including the active area 201, the substrate PS, and the active areas 214-215 and a second semiconductor structure including the active area 220, the substrate PS, and the active areas 218-219. As shown in FIG. 2A, the ESD current is discharged along y direction.

Accordingly to some embodiments, in operation during the ESD Positive-to-VSS (hereinafter referred to as "PS mode") or positive electrostatic discharged event, the transistor TP and the power clamp circuit 120 are turned on to discharge positive ESD current flowing along the y direction from the active area 202-203 to the active area 204 and from the active area 206-207 to the active area 205 in the N well NW21. The ESD current is also discharged along the y direction from the active area 208-209 to the active area 210 and from the active area 212-213 to the active area 211 in the N well NW22.

The gate structures 301-303 extend in y direction to pass through several active areas in the cell CELL1. For example, the gate structures 301 pass through the active areas 304-305. In some examples, the gate structures 301 further extend to overlap the active area 202, 203, 206, 207 or the combinations thereof. The gate structures 302-303 are configured with respect to, for example, the gate structure 301. Hence, the repetitious descriptions are omitted here. For the sake of brevity and illustrative purposes, FIG. 2A and even following FIGS. 2F, 3, 4A, and 5 depict the positions of the gate structures. Various implements are within the contemplated scope of the present disclosure.

Figure 2B:
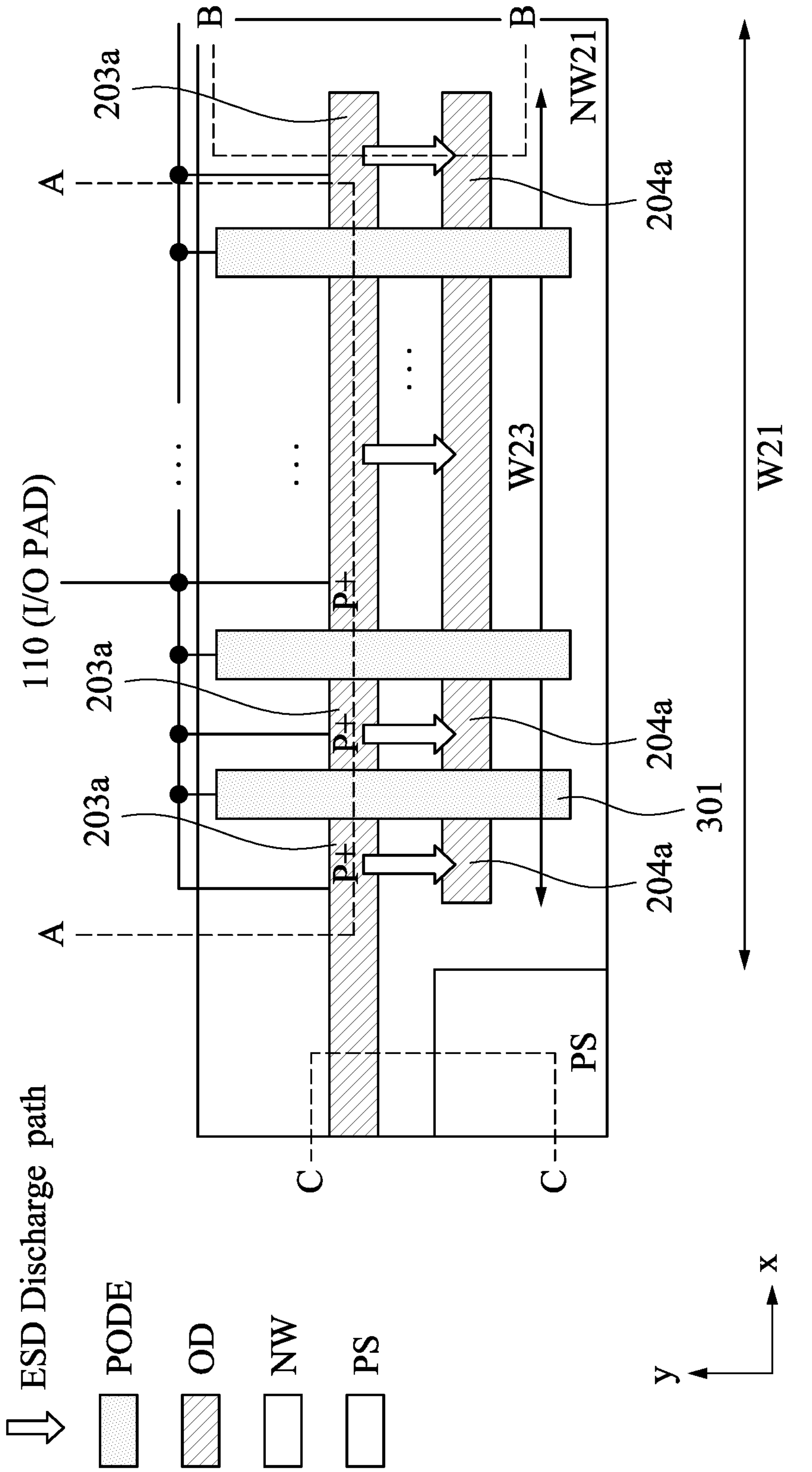
FIG. 2B is a schematic diagram in a layout view of part of the integrated circuit in FIG. 2A, in accordance with some embodiments.
Figure 2C:
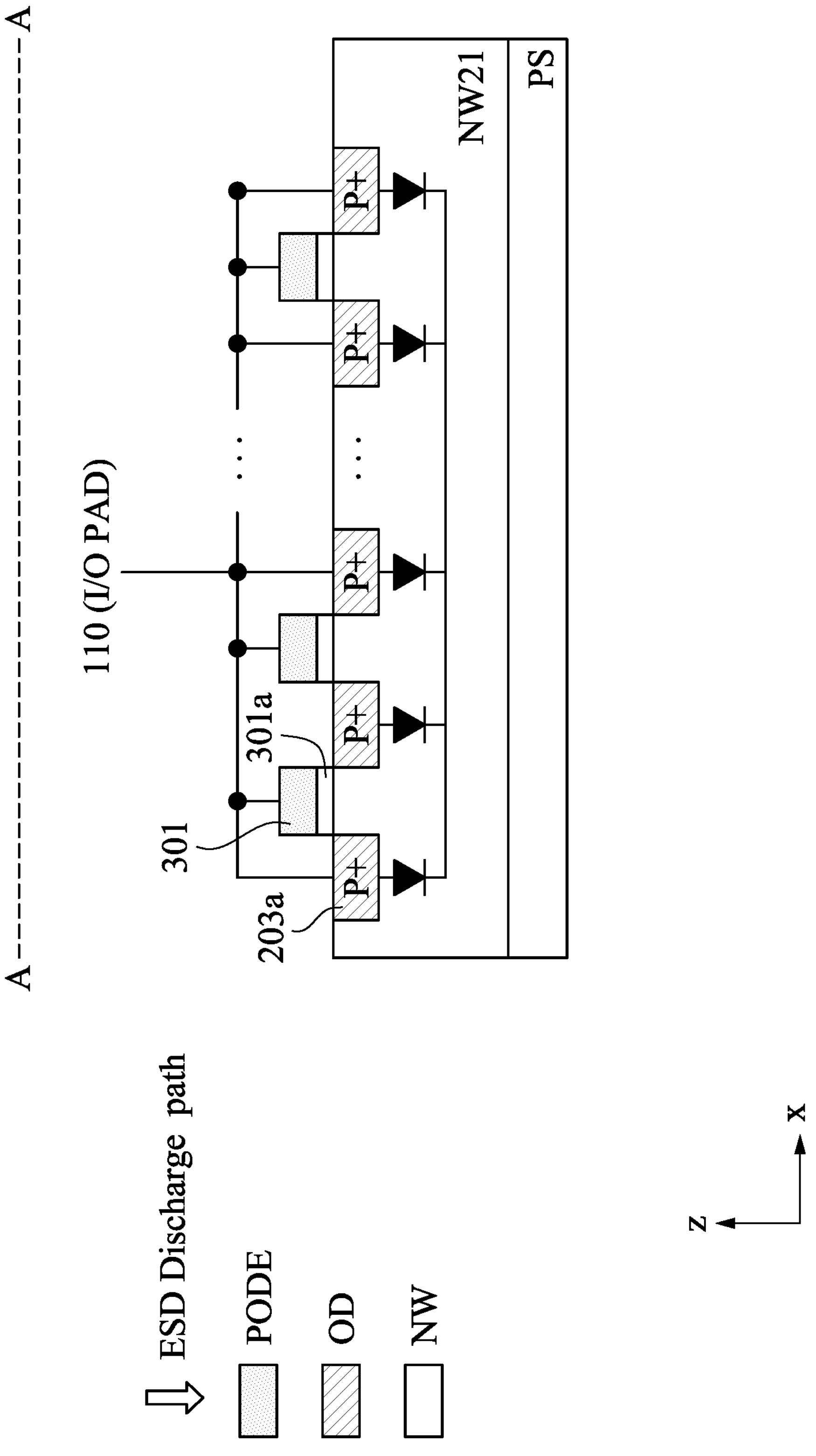
FIG. 2C is a schematic diagram in a cross-section view of part of the integrated circuit in FIG. 2B along line AA, in accordance with some embodiments.
Figure 2E:
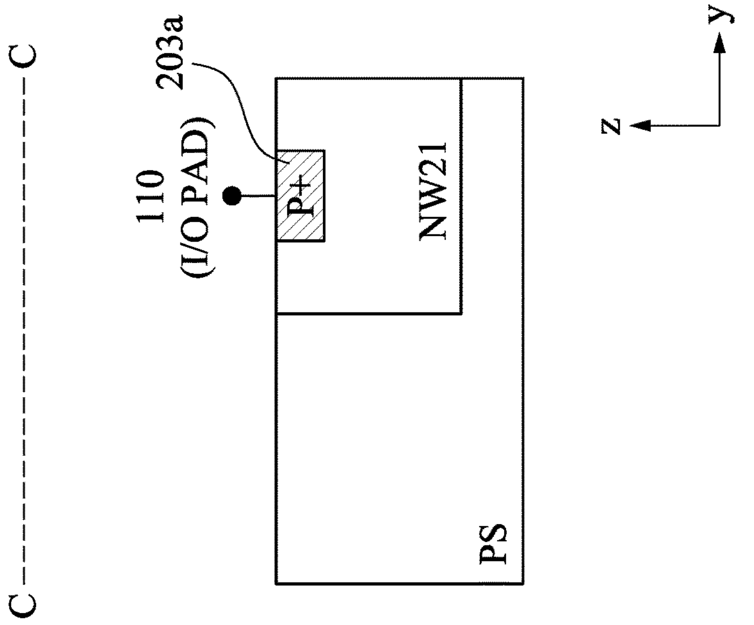
FIG. 2E is a schematic diagram in a cross-section view of part of the integrated circuit in FIG. 2B along line CC, in accordance with some embodiments.
Figure 2D:
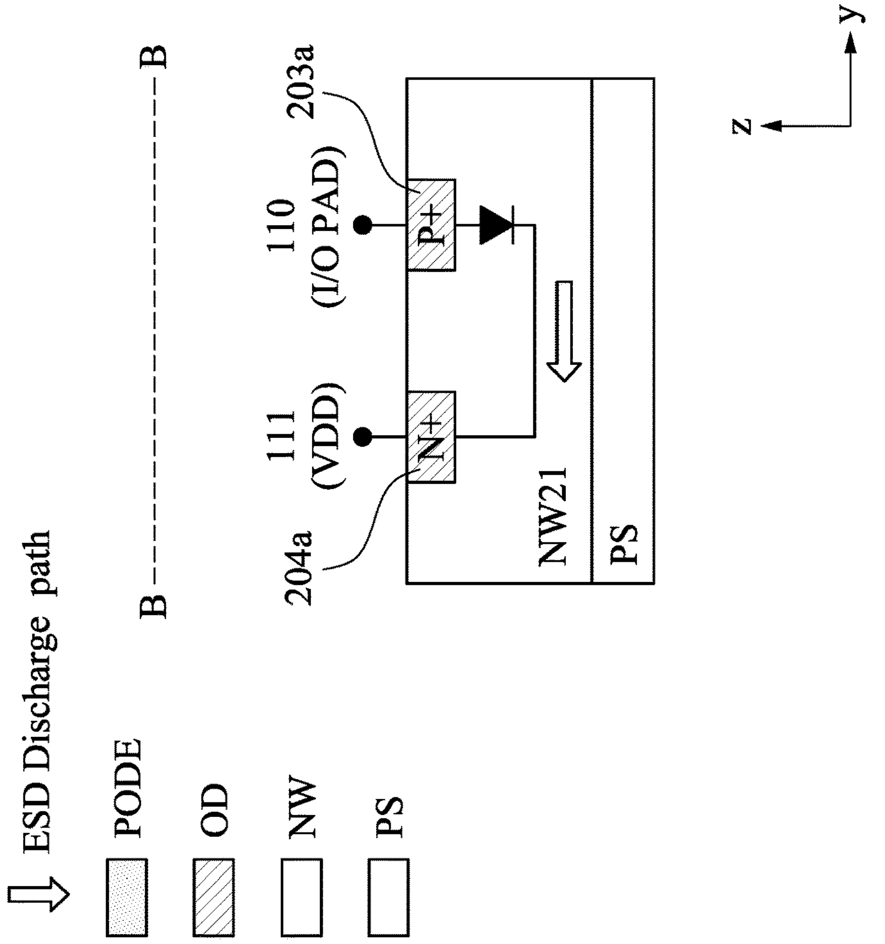
FIG. 2D is a schematic diagram in a cross-section view of part of the integrated circuit in FIG. 2B along line BB, in accordance with some embodiments.

With reference to FIGS. 2B-2E, FIG. 2B is a schematic diagram of a portion 10AA of the integrated circuit 10A in FIG. 2A, and FIGS. 2C-2D are schematic diagrams in a cross-section view of part of the integrated circuit in FIG. 2B along lines AA, BB, and CC separately.

For illustrations, the gate structures 301 in FIG. 2B extend in y direction to pass through the active areas 203-204 and coupled to the I/O pad 110. In some embodiments, the gate structures 301 correspond to the gate of the transistor TP and are disposed above gate dielectric layers 301*a*, as the planar structures shown in FIG. 2C. In some embodiments of FIG. 2B, a width W23 of the active area 204 is smaller than a width of the active area 203, yet being greater than half of the width W21 of the web portion NW21*c*. As shown in FIG. 2B, the ESD current is discharged through regions 203*a* in the active area 203 to corresponding regions 204*a* in the active area 204 within spacing between the active areas 203-204 along a direction in which the gate structures 301 extend. Specifically, in FIG. 2C the ESD current is released by the parasitical diodes between the regions 203*a* and the N well NW21, and flows to the regions 204*a* along y direction, as shown in FIG. 2D. A portion of the substrate PS is adjacent to the N well NW21 along y direction, as shown in FIGS. 2B and 2E.

In some approaches, the two adjacent P-doped and N-doped active areas discharge the ESD current along a direction in which said P-doped and N-doped active areas extend, causing the ESD current experience significant resistance induced by narrow area of the active areas and N well where the active area are disposed in. Moreover, due to uneven distances between N-doped active area and different portions of the P-doped active area, portions of the ESD current flowing through different portions of the P-doped active area are not released at the same time, which worsens the ESD protection capacity.

With the configurations of the present application, portions of the ESD current flowing through different portions are discharged between two parallel arranged active areas at the same time during ESD events. Furthermore, the widths of the cross-section active areas and N well that ESD current flows through increase, for example, around 3 times wider in the present embodiments, cutting the resistance of the ESD path. It improves the performance and reliability of the ESD protection device.

Moreover, compared with some approaches, the active areas of the same conductivity type are arranged with same cell rows in the present application as shown in FIG. 2A, which further obviates area penalty of white spaces between two doped areas of different conductivity types in the same cell rows. For example, a cell width CW21 of the cell CELL1 decreases by around 33%, which saves the area of the integrated circuit and further reduces the manufacturing cost.

Figure 2F:
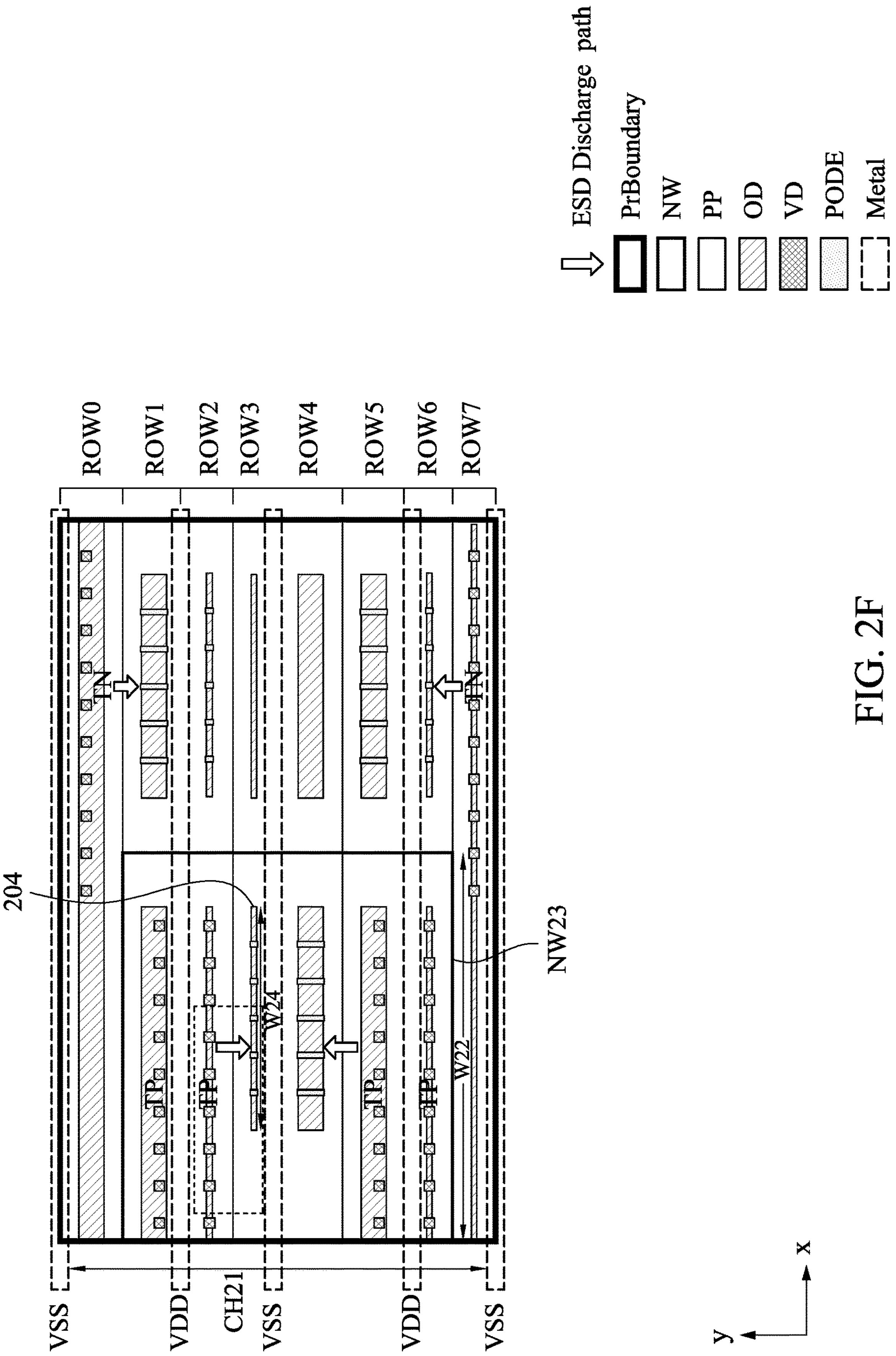
FIG. 2F is a schematic diagram in a layout view of part of the integrated circuit in FIGS. 1A-1B, in accordance with some embodiments.

The configurations of FIGS. 2A-2E are given for illustrative purposes. Various implements are within the contemplated scope of the present disclosure. For example, in some embodiments of FIG. 2F which is a schematic diagram in a layout view of part of the integrated circuit in FIGS. 1A-1B, the N well NW23 is configured with respect to, for example, the N well NW21. Compared with the N well NW21 in FIG. 2B, the N well NW23 in FIG. 2F is formed as a rectangle, having no opening. Accordingly, a width W24 of the active areas 204 and 205 is greater than the width W23 of the active area 204 of FIG. 2B. Furthermore, according to other embodiments, the transistor TP and the transistor TN are fin field-effect transistors (Fin-FETs) as embodiments of FIG. 6 and will be discussed later.

Figure 3:
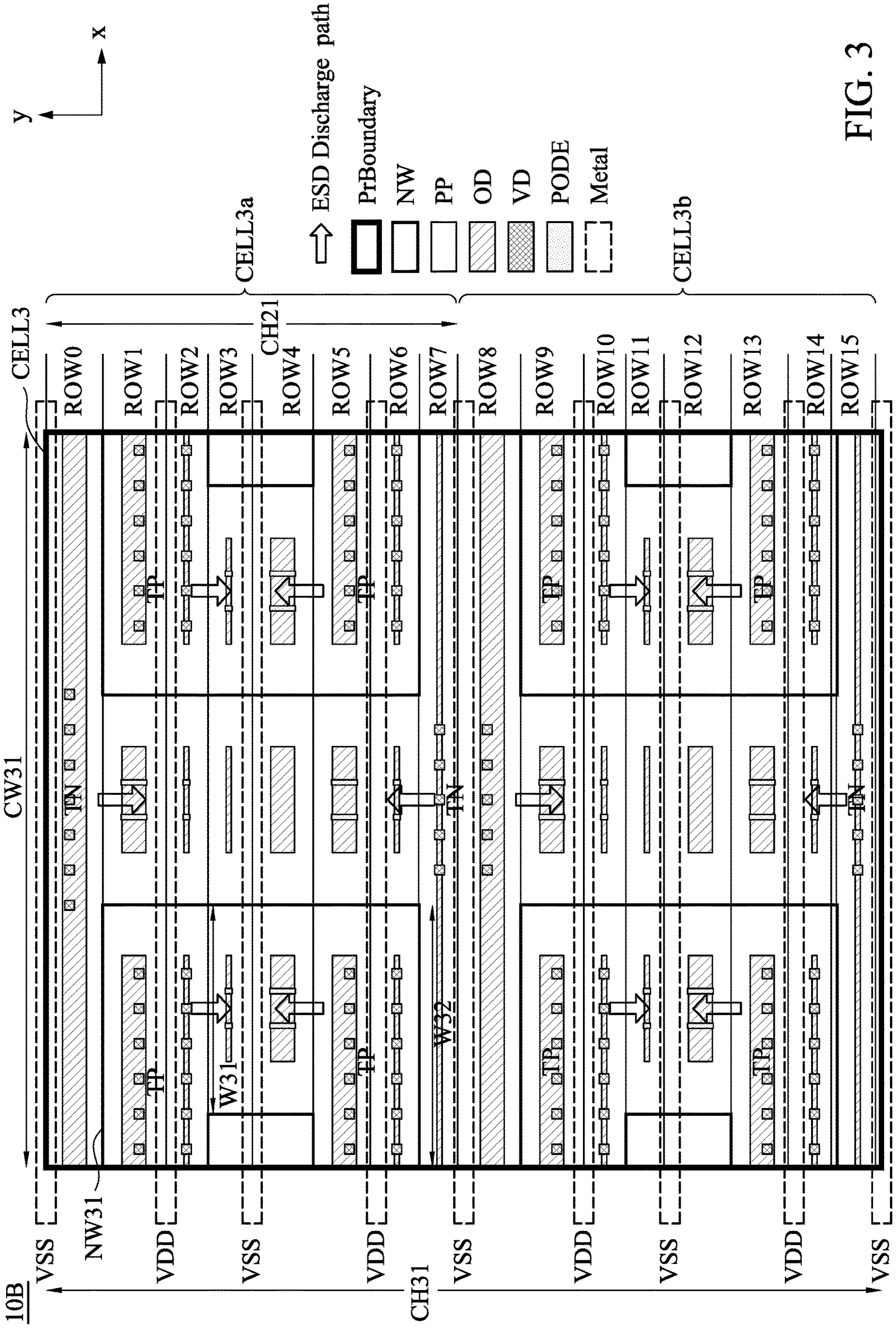
FIG. 3 is a schematic diagram in a layout view of part of an integrated circuit corresponding to FIGS. 1A-1B, in accordance with some embodiments.

Reference is now made to FIG. 3. FIG. 3 is a schematic diagram in a layout view of part of an integrated circuit 10B corresponding to FIGS. 1A-1B, in accordance with some embodiments. With respect to the embodiments of FIGS. 1A-2F, like elements in FIG. 3 are designated with the same reference numbers for ease of understanding. The specific operations of similar elements, which are already discussed in detail in above paragraphs, are omitted herein for the sake of brevity.

Compared with FIG. 2A, a cell CELL3 included in the integrated circuit 10B has a cell height which is double of the cell height CH21 of the cell CELL1 of FIG. 2A. The width of the cell CELL3 is smaller from the width of the cell CELL1. The integrated circuit 10B has two sub-cells CELL3*a*-CELL3*b* that abut each other along y direction. In some embodiments, each of the sub-cells CELL3*a*-CELL3*b* is configured with respect to, for example, the cell CELL1 of FIG. 2A. In some embodiments, a width W31 of the web portion of the N well NW31 is smaller than the width W21. The configurations of each of the sub-cells CELL3*a*-CELL3*b* are similar to cell CELL1 of FIG. 2A. Hence, the repetitious descriptions are omitted here.

Compared with some approaches, the area of the integrated circuit 10B decreases by around 49% with the configurations of the present disclosure of FIG. 3. In addition, the widths of the cross-section active areas and N well, for example, N the well NW31 that ESD current flows through increase, for example, around 2 times wider in the present embodiments, reducing the resistance of the ESD path.

Figure 4A:
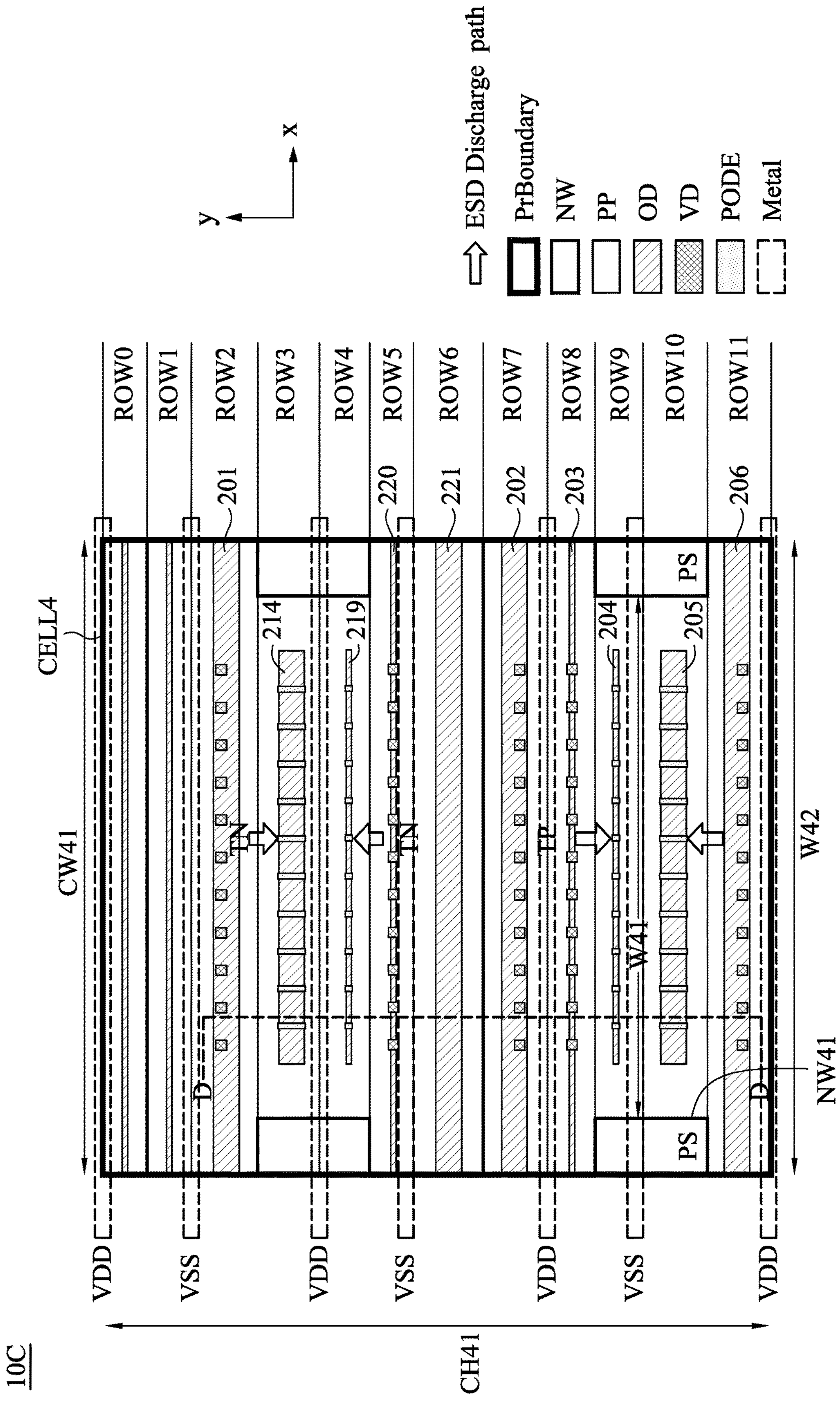
FIG. 4A is a schematic diagram in a layout view of part of an integrated circuit corresponding to FIGS. 1A-1B, in accordance with some embodiments.
Figure 4B:
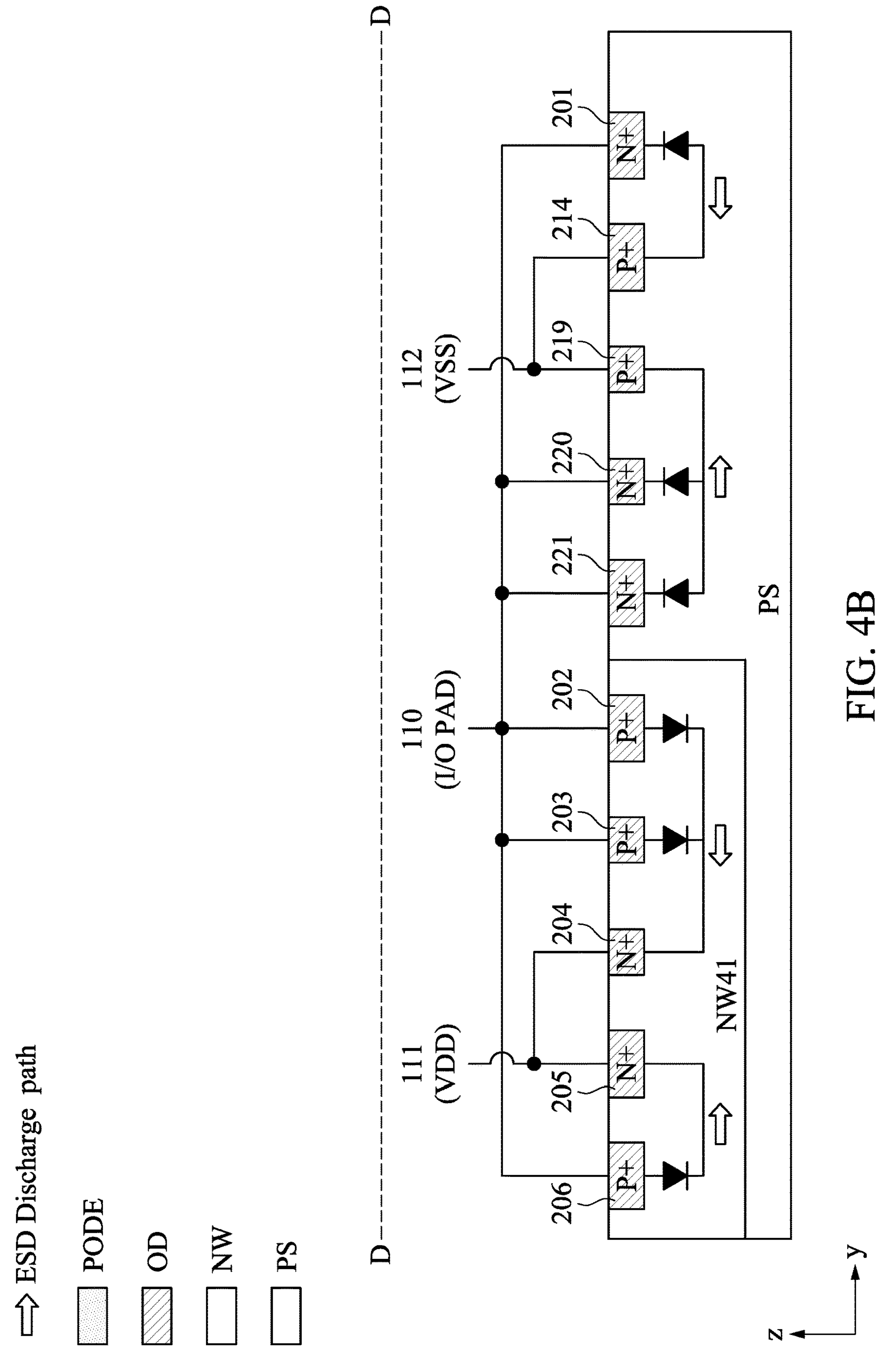
FIG. 4B is a schematic diagram in a cross-section view of part of the integrated circuit in FIG. 4A along line DD, in accordance with some embodiments.

Reference is now made to FIGS. 4A-4B. FIG. 4A is a schematic diagram in a layout view of part of an integrated circuit 10C corresponding to FIGS. 1A-1B, and FIG. 4B is a schematic diagram in a cross-section view of part of the integrated circuit 10C in FIG. 4A along line DD, in accordance with some embodiments. With respect to the embodiments of FIGS. 1A-3, like elements in FIGS. 4A-4B are designated with the same reference numbers for ease of understanding.

Compared with FIG. 2A, instead of arranging semiconductor structures corresponding to the transistor TN between two N wells NW21-NW22, the integrated circuit 10C includes a cell CELL4 having the parallel arranged transistors TP and TN. Specifically, as shown in FIG. 4A, multiple active areas are interlaced in cell rows ROW0-ROW11 along the y direction. The active areas 201 and 220 correspond to the transistor TN and the active areas 214 and 219 are coupled to the supply voltage terminal 112. The active areas 202-206 in an N well NW41 are arranged in the cell rows ROW7-ROW11. The active areas 202-203 and 206 correspond to the transistor TP and the active areas 204-205 are coupled to the supply voltage terminal 111. As shown in FIG. 4A, the cell CELL4 further includes other active areas in the cell rows ROW0-ROW1, and ROW6.

In some embodiments, the N well NW41 is configured with respect to, for example, the N well NW21 of FIG. 2A. The N well NW41 is formed as a polygon in FIG. 4A. For illustration, the N well NW41 is H-shaped, and has a first flange portion NW41*a* including the active areas 202-203, a second flange portion NW41*b* including the active area 206, and a web portion NW41*c* having the active areas 204-205. A width W41 of the web portion NW41*c* is smaller than a width W42 of the first and second flange portions NW41*a*-NW41*b*.

Compared with some approaches, the area of the integrated circuit 10B decreases by around 59% with the configurations of the present disclosure of FIG. 4A. In addition, the widths of the cross-section active areas and N well, for example, the N well NW41 that ESD current flows through increase, for example, around 4.7 times wider in the present embodiments, reducing the resistance of the ESD path.

With reference to FIG. 4B, in the ESD PS mode, the positive ESD current flows in the y direction to the supply voltage terminal 111 through the active areas 202-203, and the active area 206 to the active areas 204-205. In other embodiments, in the ESD NS mode, the negative ESD current flows in the y direction to the supply voltage terminal 112 through the active areas 221-220, and the active area 201 to the active areas 214 and 219.

Figure 5:
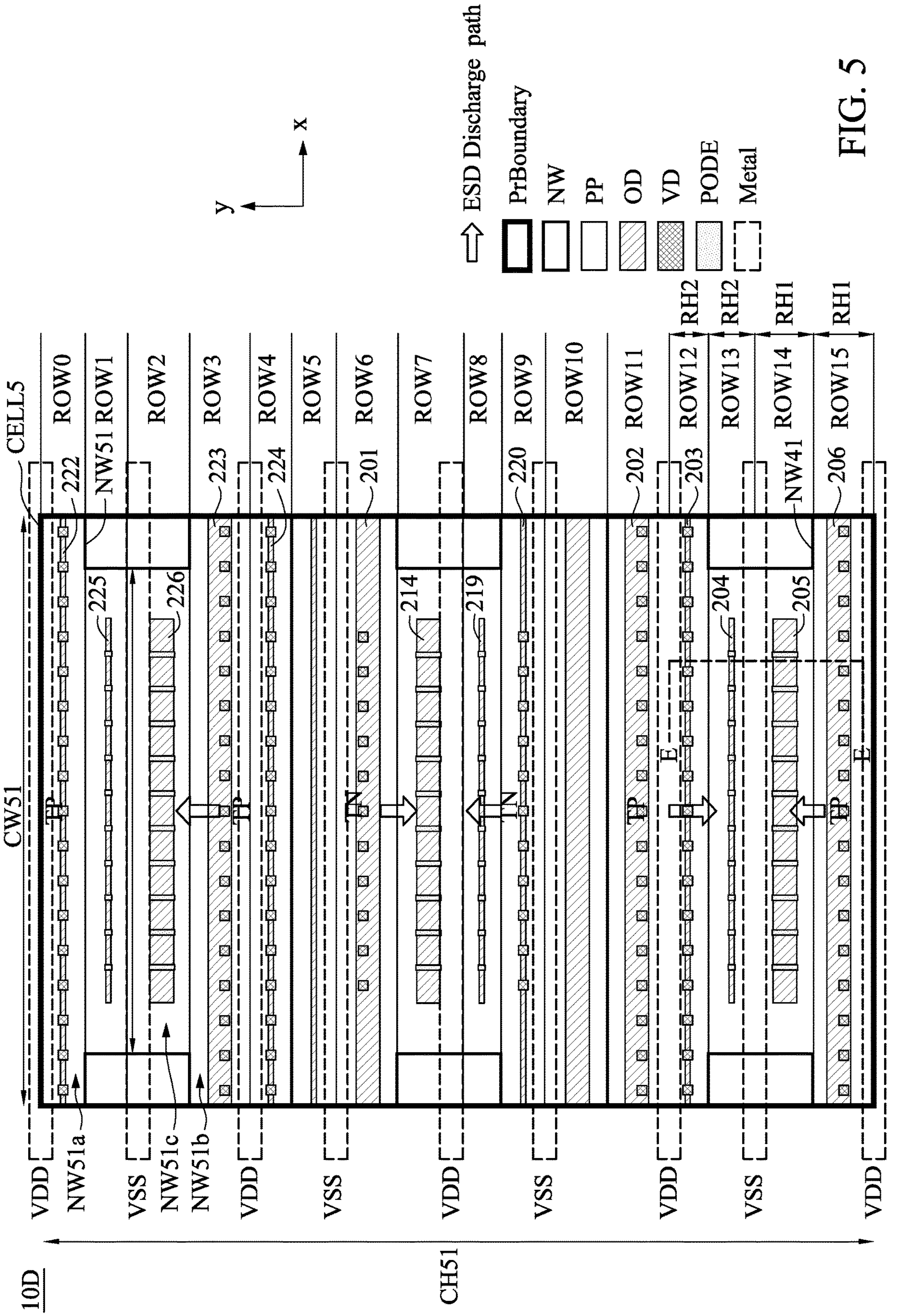
FIG. 5 is a schematic diagram in a layout view of part of an integrated circuit corresponding to FIGS. 1A-1B, in accordance with some embodiments.

Reference is now made to FIG. 5. FIG. 5 is a schematic diagram in a layout view of part of an integrated circuit 10D corresponding to FIGS. 1A-1B, in accordance with some embodiments. With respect to the embodiments of FIGS. 1A-4B, like elements in FIG. 5 are designated with the same reference numbers for ease of understanding.

Compared with FIG. 4A, the integrated circuit 10D includes a cell CELL5 having a cell height CH51 greater than a cell height CH41 of the cell CELL4. In some embodiments, the cell CELL5 is configured with respect to, for example, the cell CELL4, and further includes an H-shaped N well NW51, P-doped active areas 222-224 corresponding to the transistor TP, and N-doped active areas 225-226. As shown in FIG. 5, the N wells NW41 and NW51 are arranged on opposite sides of the active areas 201 and 214. Alternatively stated, two portions of the transistor TP are on two sides of the transistor TN.

For illustration, the active area 222 is disposed in a first flange portion NW51*a* of the N well NW51, and the active areas 223-224 are disposed in a second flange portion NW51*b* of the N well NW51. The active areas 225-226 are disposed in a web portion NW51*c* of the N well NW51.

Figure 6:
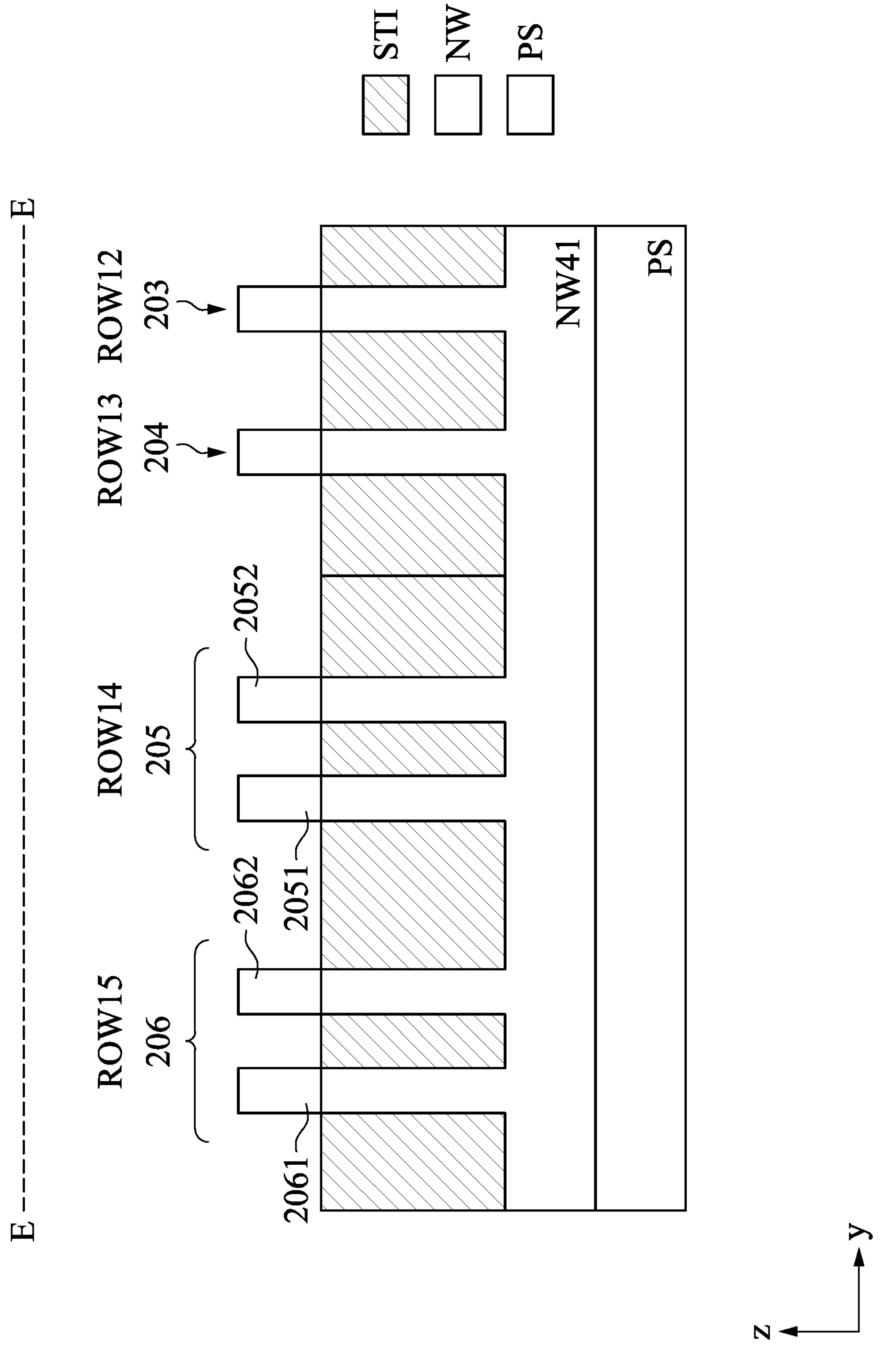
FIG. 6 is a schematic diagram in a cross-section view of part of the integrated circuit of FIG. 5 along line EE, in accordance with some embodiments.

Reference is now made to FIG. 6. FIG. 6 is a schematic diagram in a cross-section view of part of the integrated circuit of FIG. 5 along line EE, in accordance with some embodiments. With respect to the embodiments of FIGS. 1A-5, like elements in FIG. 6 are designated with the same reference numbers for ease of understanding.

In the embodiments of FIG. 6, the transistor TP and the transistor TN are fin field-effect transistors (Fin-FETs.) As illustratively shown in FIG. 6, the cell rows ROW14-ROW15 with the row height RH1 in the first group "A" includes the active areas 205-206 on the N well NW41. The active area 205 includes two fin-shaped structures 2051 and 2052, and the active area 206 includes two fin-shaped structures 2061 and 2062. Alternatively stated, each one of the active areas 205-206 includes two fin-shaped structures.

In some embodiments, the fin-shaped structures 2051-2052 are N-type fin-shaped structures, and the fin-shaped structures 2061-2062 are P-type fin-shaped structures.

As illustratively shown in FIG. 6, the cell rows ROW12-ROW13 with the row height RH2 in the second group "B" includes two active areas 203-204 on the N well NW41. The active area 203 of the cell row ROW12 includes a first one fin-shaped structure, and the active area 204 of the cell row ROW13 includes a second one fin-shaped structure. Alternatively stated, each one of the active areas 203-204 includes one fin-shaped structure.

The fins mentioned above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, such an active area may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor(s).

In some embodiments, each of the active areas 205-206 of the cell rows ROW14-ROW15 includes two fin-shaped structures together as an active region to form an integrated circuit component (such as a transistor), such that an equivalent width of the active region of the integrated circuit component disposed on the active area 205 or 206 will be wider than one of another integrated circuit component disposed on the active area 203 or 204, which includes the first one fin-shaped structure. Alternatively stated, in some embodiments, integrated circuit components disposed on the cell row ROW14 or ROW15 have a better performance than integrated circuit components disposed on the cell row ROW12 or ROW13.

Figure 7:
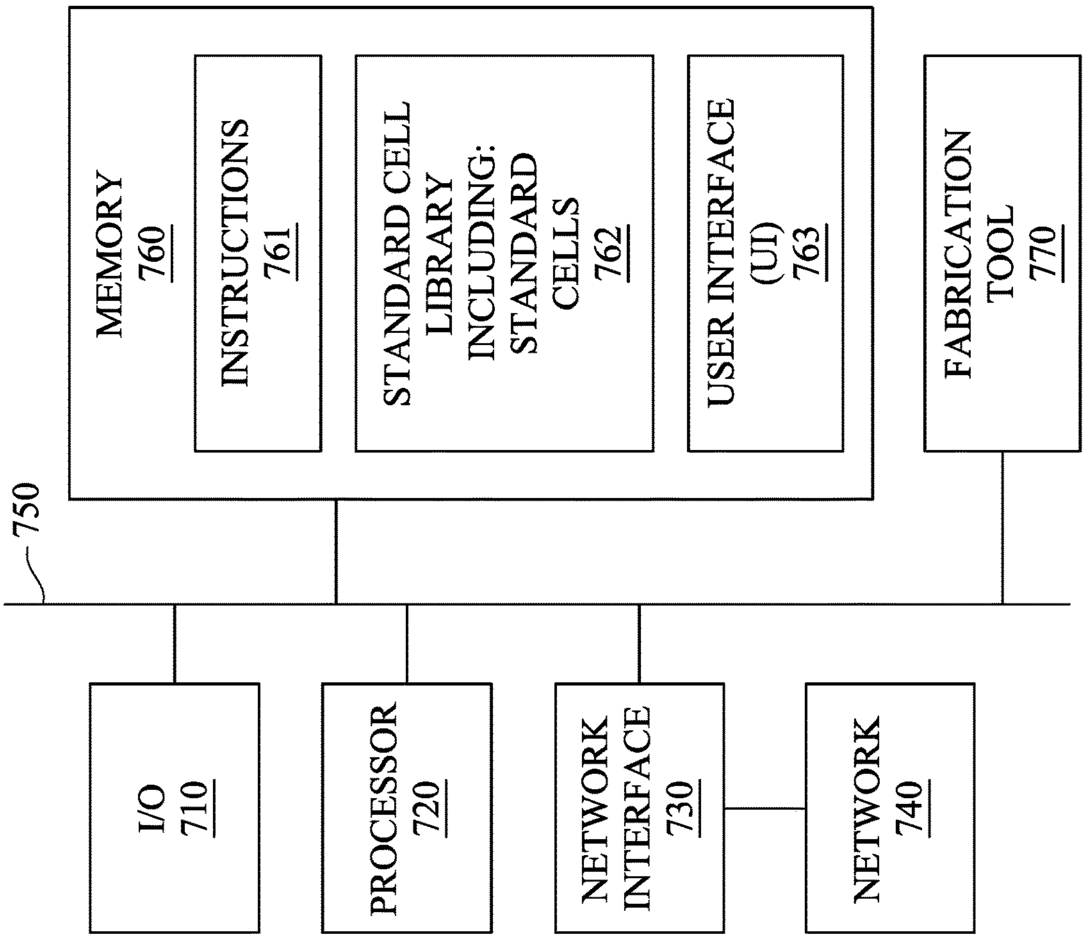
FIG. 7 is a block diagram of a system for designing the integrated circuit layout design, in accordance with some embodiments of the present disclosure.

Reference is now made to FIG. 7. FIG. 7 is a block diagram of an electronic design automation (EDA) system 700 for designing the integrated circuit layout design, in accordance with some embodiments of the present disclosure. EDA system 700 is configured to implement one or more operations for manufacturing the integrated circuits 10, 10A-10D, and further explained in conjunction with FIGS. 1A-6. In some embodiments, EDA system 700 includes an APR system.

In some embodiments, EDA system 700 is a general purpose computing device including a hardware processor 720 and a non-transitory, computer-readable storage medium 760. Storage medium 760, amongst other things, is encoded with, i.e., stores, computer program code (instructions) 761, i.e., a set of executable instructions. Execution of instructions 761 by hardware processor 720 represents (at least in part) an EDA tool which implements a portion or all of, e.g., manufacturing the integrated circuits 10, 10A-10D.

The processor 720 is electrically coupled to computer-readable storage medium 760 via a bus 750. The processor 720 is also electrically coupled to an I/O interface 710 and a fabrication tool 770 by bus 750. A network interface 730 is also electrically connected to processor 720 via bus 750. Network interface 730 is connected to a network 740, so that processor 720 and computer-readable storage medium 760 are capable of connecting to external elements via network 740. The processor 720 is configured to execute computer program code 761 encoded in computer-readable storage medium 760 in order to cause EDA system 700 to be usable for performing a portion or all of the noted processes and/or methods. In one or more embodiments, processor 720 is a central processing unit (CPU), a multi-processor, a distributed processing system, an application specific integrated circuit (ASIC), and/or a suitable processing unit.

In one or more embodiments, computer-readable storage medium 760 is an electronic, magnetic, optical, electromagnetic, infrared, and/or a semiconductor system (or apparatus or device). For example, computer-readable storage medium 760 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 760 includes a compact disk-read only memory (CD-ROM), a compact disk-read/write (CD-R/W), and/or a digital video disc (DVD).

In one or more embodiments, storage medium 760 stores computer program code 761 configured to cause EDA system 700 (where such execution represents (at least in part) the EDA tool) to be usable for performing a portion or all of the noted processes and/or methods. In one or more embodiments, storage medium 760 also stores information which facilitates performing a portion or all of the noted processes and/or methods. In one or more embodiments, storage medium 760 stores library 762 of standard cells including such standard cells as disclosed herein, for example, a cell including the cells CELL1, CELL3-CELL5 in FIG. 2A-5.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 720.

EDA system 700 also includes network interface 730 coupled to processor 720. Network interface 730 allows EDA system 700 to communicate with network 740, to which one or more other computer systems are connected. Network interface 730 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 also includes the fabrication tool 770 coupled to processor 720. The fabrication tool 770 is configured to fabricate integrated circuits, e.g., the integrated circuits 10, 10A-10D illustrated in FIGS. 1A-6, according to the design files processed by the processor 720.

EDA system 700 is configured to receive information through I/O interface 710. The information received through I/O interface 710 includes one or more of instructions, data, design rules, libraries of standard cells, and/or other parameters for processing by processor 720. The information is transferred to processor 720 via bus 750. EDA system 700 is configured to receive information related to a UI through I/O interface 710. The information is stored in computer-readable medium 760 as user interface (UI) 763.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 8:
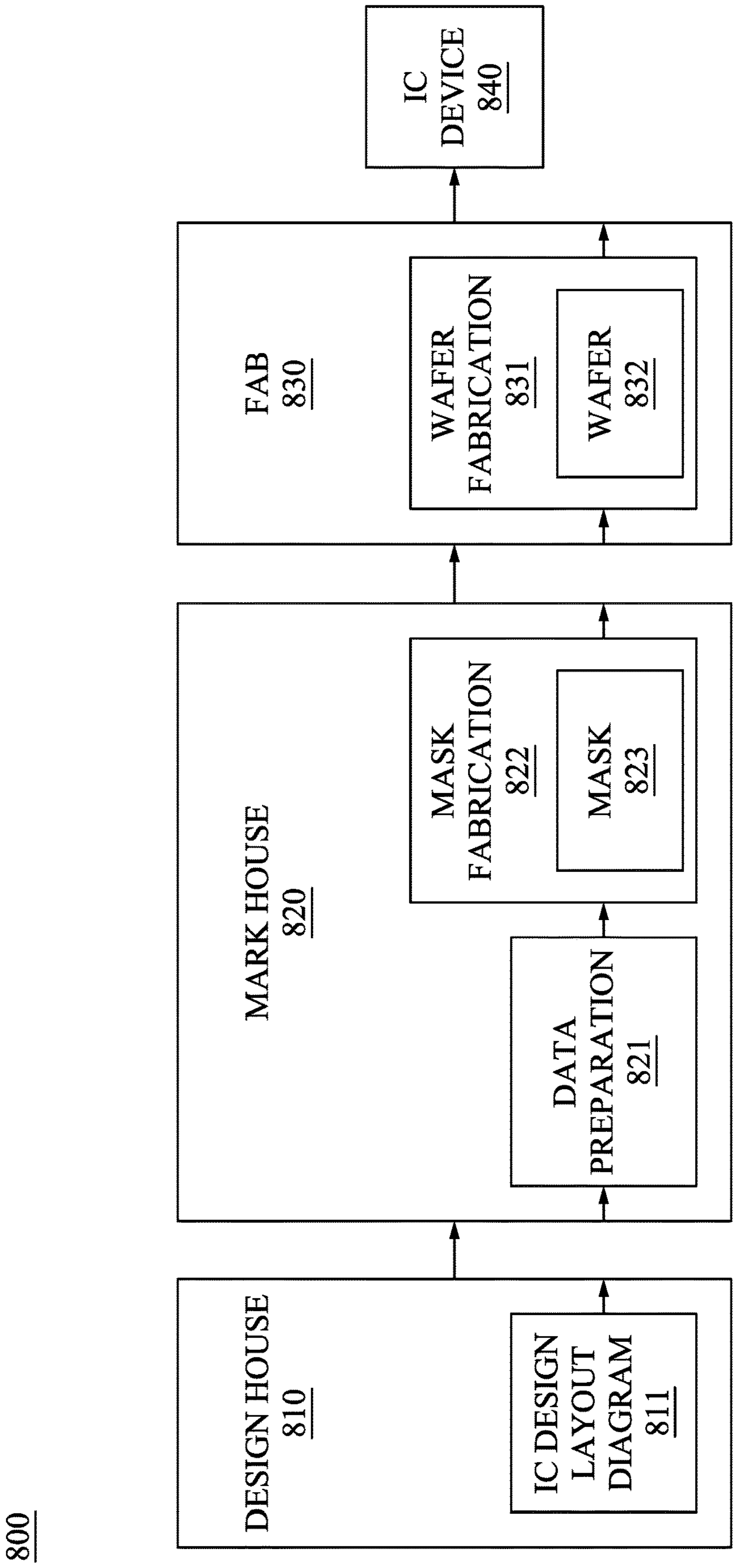
FIG. 8 is a block diagram of an integrated circuit manufacturing system, and an integrated circuit manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 800.

In FIG. 8, IC manufacturing system 800 includes entities, such as a design house 810, a mask house 820, and an IC manufacturer/fabricator ("fab") 830, that interact with one another in the design, development, and manufacturing cycles and/or services related to manufacturing an IC device 840. The entities in IC manufacturing system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 810, mask house 820, and IC fab 830 is owned by a single larger company. In some embodiments, two or more of design house 810, mask house 820, and IC fab 830 coexist in a common facility and use common resources.

Design house (or design team) 810 generates an IC design layout diagram 811. IC design layout diagram 811 includes various geometrical patterns, for example, an IC layout design depicted in FIG. 2A, FIG. 2F, FIG. 3, FIG. 4A, and FIG. 5, designed for an IC device 840, for example, integrated circuits 10, 10A-10D, discussed above with respect to FIGS. 1A-6. The geometrical patterns correspond to patterns of metal, oxide, or semiconductor layers that make up the various components of IC device 840 to be fabricated. The various layers combine to form various IC features. For example, a portion of IC design layout diagram 811 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 810 implements a proper design procedure to form IC design layout diagram 811. The design procedure includes one or more of logic design, physical design or place and route. IC design layout diagram 811 is presented in one or more data files having information of the geometrical patterns. For example, IC design layout diagram 811 can be expressed in a GDSII file format or DFII file format.

Mask house 820 includes data preparation 821 and mask fabrication 822. Mask house 820 uses IC design layout diagram 811 to manufacture one or more masks 823 to be used for fabricating the various layers of IC device 840 according to IC design layout diagram 811. Mask house 820 performs mask data preparation 821, where IC design layout diagram 811 is translated into a representative data file ("RDF"). Mask data preparation 821 provides the RDF to mask fabrication 822. Mask fabrication 822 includes a mask writer. A mask writer converts the RDF to an image on a substrate, such as a mask (reticle) 823 or a semiconductor wafer 833. The IC design layout diagram 811 is manipulated by mask data preparation 821 to comply with particular characteristics of the mask writer and/or requirements of IC fab 830. In FIG. 8, data preparation 821 and mask fabrication 822 are illustrated as separate elements. In some embodiments, data preparation 821 and mask fabrication 822 can be collectively referred to as mask data preparation.

In some embodiments, data preparation 821 includes optical proximity correction (OPC) which uses lithography enhancement techniques to compensate for image errors, such as those that can arise from diffraction, interference, other process effects and the like. OPC adjusts IC design layout diagram 811. In some embodiments, data preparation 821 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 821 includes a mask rule checker (MRC) that checks the IC design layout diagram 811 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 811 to compensate for limitations during mask fabrication 822, which may undo part of the modifications performed by OPC in order to meet mask creation rules.

In some embodiments, data preparation 821 includes lithography process checking (LPC) that simulates processing that will be implemented by IC fab 830 to fabricate IC device 840. LPC simulates this processing based on IC design layout diagram 811 to create a simulated manufactured device, such as IC device 840. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 811.

It should be understood that the above description of data preparation 821 has been simplified for the purposes of clarity. In some embodiments, data preparation 821 includes additional features such as a logic operation (LOP) to modify the IC design layout diagram 811 according to manufacturing rules. Additionally, the processes applied to IC design layout diagram 811 during data preparation 821 may be executed in a variety of different orders.

After data preparation 821 and during mask fabrication 822, a mask 823 or a group of masks 823 are fabricated based on the modified IC design layout diagram 811. In some embodiments, mask fabrication 822 includes performing one or more lithographic exposures based on IC design layout diagram 811. In some embodiments, an electron-beam (e-beam) or a mechanism of multiple e-beams is used to form a pattern on a mask (photomask or reticle) 823 based on the modified IC design layout diagram 811. Mask 823 can be formed in various technologies. In some embodiments, mask 823 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 823 includes a transparent substrate (for example, fused quartz) and an opaque material (for example, chromium) coated in the opaque regions of the binary mask. In another example, mask 823 is formed using a phase shift technology. In a phase shift mask (PSM) version of mask 823, various features in the pattern formed on the phase shift mask are configured to have proper phase difference to enhance the resolution and imaging quality. In various examples, the phase shift mask can be attenuated PSM or alternating PSM. The mask(s) generated by mask fabrication 822 is used in a variety of processes. For example, such a mask(s) is used in an ion implantation process to form various active areas in semiconductor wafer 833, in an etching process to form various etching regions in semiconductor wafer 833, and/or in other suitable processes.

IC fab 830 includes wafer fabrication 832. IC fab 830 is an IC fabrication business that includes one or more manufacturing facilities for the fabrication of a variety of different IC products. In some embodiments, IC Fab 830 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 830 uses mask(s) 823 fabricated by mask house 820 to fabricate IC device 840. Thus, IC fab 830 at least indirectly uses IC design layout diagram 811 to fabricate IC device 840. In some embodiments, semiconductor wafer 833 is fabricated by IC fab 830 using mask(s) 823 to form IC device 840. In some embodiments, the IC fabrication includes performing one or more lithographic exposures based at least indirectly on IC design layout diagram 811. Semiconductor wafer 833 includes a silicon substrate or other proper substrate having material layers formed thereon. Semiconductor wafer 833 further includes one or more of various active areas, dielectric features, multilevel interconnects, and the like (formed at subsequent manufacturing steps).

The present application provides an integrated circuit including an ESD protection device including active areas that are in polygon wells and formed vertical ESD current discharge paths. With the configurations of the present application, the ESD currents experience less resistance due to enlarged width of the wells and are released at the same time, and accordingly, enhanced ESD protection is provided. Furthermore, the active areas of the same conductivity type are arranged with same cell rows in the present application, which further obviates area penalty of white spaces between two doped areas of different conductivity types in the same cell rows. Alternatively stated, manufacturing cost of the integrated circuit is cut.

As described above, the integrated circuit of the present disclosure provides a first active area of a first conductivity type being coupled to an input/output (I/O) pad; a second active area of a second conductivity type, different from the first conductivity type, being coupled to a first supply voltage terminal; a plurality of first gate structures extending in a first direction to pass through the first and second active areas; and a first well of the second conductivity type extending along the first direction. The first and second active areas extend along a second direction different from the first direction in the first well, and the first active area is aligned with the second active area along the first direction.

In some embodiments, integrated circuit further includes a third active area of the second conductivity type being coupled to the first supply voltage terminal; and a fourth active area of the first conductivity type being coupled to the I/O pad. The third and fourth active areas are in the first well, and the third active area is interposed between the second active area and the fourth active area.

In some embodiments, a fin number of the first and active areas is different from a fin number of the third and fourth active areas.

In some embodiments, the first well is C-shaped in a layout view.

In some embodiments, the first well is H-shaped. The first active area and the fourth active area are arranged in flange portions of the first well, and the second to third active areas are arranged in a web portion of the first well.

In some embodiments, the first and second active areas and the first well are configured to discharge an electrostatic discharge current flowing along the first direction.

In some embodiments, integrated circuit further includes a third active area of the first conductivity type that is adjacent to the first active area in a first row and coupled to a second supply voltage terminal; and a fourth active area of the second conductivity type that is arranged in a second row separated from the first row in the first direction and is coupled to the I/O pad. The third and fourth active areas are configured to discharge an electrostatic discharge current flowing along the first direction.

In some embodiments, integrated circuit further includes a fifth active area of the first conductivity type being coupled to the I/O pad; and a sixth active area of the second conductivity type being coupled to the first supply voltage terminal. The fifth and sixth active areas are in a second well of the second conductivity type. The first and second wells are C-shaped, and web portions of the first and second wells are back to back arranged in a layout view.

In some embodiments, integrated circuit further includes a third active area of the first conductivity type coupled to a second supply voltage terminal; and a fourth active area of the second conductivity type coupled to the I/O pad. The third and fourth active areas are configured to discharge an electrostatic discharge current flowing along the first direction. Each of the first to fourth active areas is disposed in a corresponding one in multiple cell rows arranged along the first direction.

Also disclosed is an integrated circuit that includes a first well of a first conductivity type formed a polygon shape; and multiple first active areas arranged in the first well wherein each of the first active areas is disposed in a corresponding one in multiple cell rows that are arranged along a first direction. At least one first area in the first active areas is coupled to an input/output (I/O) pad and arranged in at least one flange portion of the first well. At least one second area in the first active areas is coupled to a first supply voltage terminal and arranged in a web portion of the first well.

In some embodiments, the at least one first area, the at least one second area, and the first well are configured to discharge an electrostatic discharge current flowing along the first direction. The at least one first area and the at least one second area have different conductivity types.

In some embodiments, the at least one first area includes multiple the first areas, the at least one second area includes multiple the second areas, and at least one flange portion includes first and second flange portions. A first portion of the first areas is arranged in the first flange portion, and a second portion of the areas is arranged in the second flange portion. The second areas are interposed between the first and second flange portions.

In some embodiments, the at least one first area and the at least second area extend in a second direction different from the first direction. A width of the at least one first area is different from a width of the at least one second area.

In some embodiments, integrated circuit further includes a gate structure that extends in the first direction to pass through the at least one first area and the at least second area and is coupled to the I/O pad.

Also disclosed is an integrated circuit includes a first active area of a first conductivity type and a second active area of a second conductivity type different from the first conductivity type; and a first gate structure extending in a first direction to pass through the first and second active areas. The first active area and the second active area are disposed in a first well of the second conductivity type. The first active area and the first gate structure are coupled to an input/output (I/O) pad, and the second active area is coupled to a first supply voltage terminal. The first active area, the first gate structure, and the first well are included in a first transistor. The first transistor and the second active area are configured to discharge a first electrostatic discharge (ESD) current flowing between the I/O pad and the first supply voltage terminal.

In some embodiments, the first active area is arranged in a first portion of the first well, and the second active area is arranged in a second portion of the first well. Along a second direction different from the first direction, a width of the first portion of the first well is greater than a width of the second portion of the first well.

In some embodiments, integrated circuit further includes a third active area of the second conductivity type being coupled to the first supply voltage terminal; and a fourth active area of the first conductivity type being coupled to the I/O pad. The third and fourth active areas are in the first well, and the second to third active areas are interposed between the first and fourth active areas.

In some embodiments, integrated circuit further includes a third active area of the first conductivity type and a fourth active area of the second conductivity type; and a fifth active area of the first conductivity type and a sixth active area of the second conductivity type included in a second transistor. The third to fourth active areas are disposed in a second well of the second conductivity type. The second transistor and the fifth active area are configured to discharge a second ESD current flowing between the I/O pad and a second supply voltage terminal different from the first supply voltage terminal. Along the first direction the first well and the second well are arranged on opposite sides of the fifth to sixth active areas.

In some embodiments, the first and second wells are C-shaped.

In some embodiments, the first and second wells are H-shaped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
- a first active area of a first conductivity type being coupled to an input/output (I/O) pad;
- a second active area of a second conductivity type, different from the first conductivity type, being coupled to a first supply voltage terminal;
- a plurality of first gate structures extending in a first direction to pass through the first and second active areas; and
- a first well of the second conductivity type extending along the first direction,
- wherein the first and second active areas extend along a second direction different from the first direction in the first well, and the first active area is aligned with the second active area along the first direction.

2. The integrated circuit of claim 1, further comprising:
- a third active area of the second conductivity type being coupled to the first supply voltage terminal; and
- a fourth active area of the first conductivity type being coupled to the I/O pad,
- wherein the third and fourth active areas are in the first well, and the third active area is interposed between the second active area and the fourth active area.

3. The integrated circuit of claim 2, wherein a fin number of the first and second active areas is different from a fin number of the third and fourth active areas.

4. The integrated circuit of claim 2, wherein the first well is C-shaped in a layout view.

5. The integrated circuit of claim 2, wherein the first well is H-shaped,
- wherein the first active area and the fourth active area are arranged in flange portions of the first well, and the second to third active areas are arranged in a web portion of the first well.

6. The integrated circuit of claim 1, wherein the first and second active areas and the first well are configured to discharge an electrostatic discharge current flowing along the first direction.

7. The integrated circuit of claim 1, further comprising:
- a third active area of the first conductivity type that is adjacent to the first active area in a first row and coupled to a second supply voltage terminal; and
- a fourth active area of the second conductivity type that is arranged in a second row separated from the first row in the first direction and is coupled to the I/O pad, wherein the third and fourth active areas are configured to discharge an electrostatic discharge current flowing along the first direction.

8. The integrated circuit of claim 7, further comprising:
- a fifth active area of the first conductivity type being coupled to the I/O pad; and
- a sixth active area of the second conductivity type being coupled to the first supply voltage terminal, wherein the fifth and sixth active areas are in a second well of the second conductivity type,
- wherein the first and second wells are C-shaped, and web portions of the first and second wells are back to back arranged in a layout view.

9. The integrated circuit of claim 1, further comprising:
- a third active area of the first conductivity type coupled to a second supply voltage terminal; and
- a fourth active area of the second conductivity type coupled to the I/O pad, wherein the third and fourth active areas are configured to discharge an electrostatic discharge current flowing along the first direction,
- wherein each of the first to fourth active areas is disposed in a corresponding one in a plurality of cell rows arranged along the first direction.

10. An integrated circuit, comprising:
- a first well of a first conductivity type formed a polygon shape; and
- a plurality of first active areas arranged in the first well wherein each of the plurality of first active areas is disposed in a corresponding one in a plurality of cell rows that are arranged along a first direction,
- wherein at least one first area in the plurality of first active areas is coupled to an input/output (I/O) pad and arranged in at least one flange portion of the first well,
- wherein at least one second area in the plurality of first active areas is coupled to a first supply voltage terminal and arranged in a web portion of the first well.

11. The integrated circuit of claim 10, wherein the at least one first area, the at least one second area, and the first well are configured to discharge an electrostatic discharge current flowing along the first direction, wherein the at least one first area and the at least one second area have different conductivity types.

12. The integrated circuit of claim 10, wherein the at least one first area comprises a plurality of the first areas, the at least one second area comprises a plurality of the second areas, and the at least one flange portion comprises first and second flange portions, wherein a first portion of the plurality of the first areas is arranged in the first flange portion, and a second portion of the plurality of the first areas is arranged in the second flange portion, wherein the plurality of the second areas are interposed between the first and second flange portions.

13. The integrated circuit of claim 10, wherein the at least one first area and the at least second area extend in a second direction different from the first direction, wherein a width of the at least one first area is different from a width of the at least one second area.

14. The integrated circuit of claim 10, further comprising:

a gate structure that extends in the first direction to pass through the at least one first area and the at least second area and is coupled to the I/O pad.

15. An integrated circuit, comprising:

a first active area of a first conductivity type and a second active area of a second conductivity type different from the first conductivity type, wherein the first active area and the second active area are disposed in a first well of the second conductivity type; and a first gate structure extending in a first direction to pass through the first and second active areas, wherein the first active area and the first gate structure are coupled to an input/output (I/O) pad, and the second active area is coupled to a first supply voltage terminal, wherein the first active area, the first gate structure, and the first well are included in a first transistor, wherein the first transistor and the second active area are configured to discharge a first electrostatic discharge (ESD) current flowing between the I/O pad and the first supply voltage terminal.

16. The integrated circuit of claim 15, wherein the first active area is arranged in a first portion of the first well, and the second active area is arranged in a second portion of the first well, wherein along a second direction different from the first direction, a width of the first portion of the first well is greater than a width of the second portion of the first well.

17. The integrated circuit of claim 15, further comprising:

a third active area of the second conductivity type being coupled to the first supply voltage terminal; and a fourth active area of the first conductivity type being coupled to the I/O pad, wherein the third and fourth active areas are in the first well, and the second to third active areas are interposed between the first and fourth active areas.

18. The integrated circuit of claim 15, further comprising:

a third active area of the first conductivity type and a fourth active area of the second conductivity type, wherein the third to fourth active areas are disposed in a second well of the second conductivity type; and a fifth active area of the first conductivity type and a sixth active area of the second conductivity type included in a second transistor, wherein the second transistor and the fifth active area are configured to discharge a second ESD current flowing between the I/O pad and a second supply voltage terminal different from the first supply voltage terminal, wherein along the first direction the first well and the second well are arranged on opposite sides of the fifth to sixth active areas.

19. The integrated circuit of claim 18, wherein the first and second wells are C-shaped.

20. The integrated circuit of claim 18, wherein the first and second wells are H-shaped.

* * * * *